United States Patent [19]

Theus et al.

[11] Patent Number: 4,882,610
[45] Date of Patent: Nov. 21, 1989

[54] PROTECTIVE ARRANGEMENT FOR MOS CIRCUITS

[75] Inventors: Ulrich Theus, Gundelfingen; Burkhard Giebel, Denzlingen, both of Fed. Rep. of Germany

[73] Assignee: Deutsche ITT Industries GmbH, Freiburg, Fed. Rep. of Germany

[21] Appl. No.: 254,071

[22] Filed: Oct. 6, 1988

[30] Foreign Application Priority Data

Oct. 29, 1987 [EP] European Pat. Off. ............ 87115862
Mar. 29, 1988 [EP] European Pat. Off. ............ 87105063

[51] Int. Cl.$^4$ ............................................ H01L 29/78
[52] U.S. Cl. ...................................... 357/23.13; 357/51
[58] Field of Search ....................... 357/23.13, 51, 41; 361/91

[56] References Cited

U.S. PATENT DOCUMENTS 4,509,067 4/1985 Minami et al. ..................... 357/13
4,757,363 7/1988 Bohm et al. ..................... 357/23.13

FOREIGN PATENT DOCUMENTS 0260125 3/1988 European Pat. Off. .
1639255 2/1968 Fed. Rep. of Germany .
WO/8606213 10/1986 PCT Int'l Appl. .
2151183A 7/1985 United Kingdom .

OTHER PUBLICATIONS

Proceedings of the 1980 Electrical Overstress/Electrostatic Discharge Symposium, 1980, pp. 73-80, J. K. Keller: "Protection of MOS Integrated Circuits from Destruction by Electrostatic Discharge".

Primary Examiner—Andrew J. James
Assistant Examiner—Mark Prenty
Attorney, Agent, or Firm—Thomas L. Peterson

[57] ABSTRACT

In this protective arrangement, a resistor between a pad (p) and a transistor to be protected is implemented with an expansion region (e) which lies completely below the pad (p) and extends beyond the latter along the entire circumference of the pad. An elongate region (z) extends along the circumference of the expansion region (e) and is connected to circuit ground via an interconnection track (b). The connection between the elongate region (z) and the interconnection track (b) has a low resistance.

6 Claims, 3 Drawing Sheets

PROTECTIVE ARRANGEMENT FOR MOS CIRCUITS

BACKGROUND OF THE INVENTION

1. Field of the Invention

The present invention relates to a protective arrangement for MOS circuits (insulated-gate field-effect transistor integrated circuites) which lies between a pad on an insulating layer covering the substrate of the MOS circuit and a transistor to be protected, which pad contains a resistor of the opposite conductivity type, and which resistor is incorporated in the substrate and which connects the pad to a terminal of the transistor.

2. Description of the Prior Art

Protective arrangements have been used since the early times of MOS integrated circuits to protect the sensitive gate insulating layer of the MOS device from static and/or dynamic overvoltages which reach the pad and, thus, the gate of the associated transistor via the external terminals of a packaged integrated circuit. If the dielectric strength of the gate insulating layer is exceeded, the gate insulating layer could be destroyed. The prior art is described, for example, in Kubo, "Breakdown Preventing Circuit and an Integrated Device Thereof for a Semiconductor Device Having an Insulate Gate Electrode," U.S. Pat. No. 3,590,340. If necessary, a bypass transistor may be connected to the junction between the resistor and the transistor to be protected.

It turned out, however, that the insertion of a resistor between the pad and the transistor to be protected and the use of a bypass transistor are not sufficient. Further steps are necessary to ensure that the arrangement serves its purpose if the integrated circuits are to pass the curent standard test, in which a voltage pulse of the order of 2 kV, which can cause a pulsed current of the order of 1A, is applied from a capacitor through a series resistor to a pad.

The object of the invention as claimed is to improve the prior art protective arrangement in such a way that it reliably protects the transistors coupled to the pad of a MOS integrated circuit, at least at the above test values.

BRIEF SUMMARY OF THE INVENTION

The protective arrangement according to the invention ensures reliable protection beyond the above test conditions. This is achieved without any additional process steps in the fabrication of the MOS integrated circuit, i.e., exclusively by providing additional regions and areas of a kind which can be formed with process steps that are necessary in the fabrication of the MOS integrated circuit.

More specifically the invention is an improvement in a protective arrangement for an insulated-gate field-effect transistor integrated circuit (MOS circuit). The improvement is disposed between a pad (p) on an insulating layer (i) covering the substrate (s) of the MOS circuit and a transistor to be protected including a resistor of the opposite conductivity type which is incorporated in the substrate (s). The resistor connects the pad to a terminal of the transistor. The resistor is an expansion region (e) whose areal form is similar to that of the pad (p) and whose area supporting the pad, which is preferably the central area of the expansion region (e) and to which central area low-resistance contact is made via the pad, is greater than the pad area. The edge of the expansion region (e) is accompanied, at least in part, by an elongate region (z, z1, z2) of preferably minimum width spaced a minimum distance therefrom, which:

(1) is of the same conductivity type and has the same resistivity as the expansion region (e); and (2) is contacted at its surface by means of an interconnection track (b) connected to circuit ground, the connection between the surface and the interconnection track (b) having low resistance.

In one embodiment the expansion region (e) continues as an elongate resistance region (w, w1, w2) which is incorporated in the substrate (s), extends parallel to at least one lateral edge (k) of the expansion region (e), and is separated from the latter by an elongate region (z, z1, z2) of minimum width which also extends parallel to that long side (ls) of the resistance region (w, w1, w2), which is farthest from the expansion region, up to one end of the resistance region (w, w1, w2).

In another embodiment the resistance of the resistance region (w, w1, w2) is just high enough not to interfere with the operation of the MOS circuit. FIG. 5 is drawn approximately to scale so that in the illustrated embodiment the component portions of the pad can be deduced from the overall pad size, which is 100 by 100 micrometers as shown in FIG. 5. The resistance region (w, w1, w2) has such an area, that the voltage drop caused across it by a specified test current value, is equal to the breakdown voltage of the pn junction between the expansion region (e) and the substrate (s).

The invention and its embodiments may be better understood by now turning to the following drawings wherein like elements are referenced by like numerals.

BRIEF DESCRIPTION OF THE DRAWINGS

The invention will now be explained in more detail with reference to the accompanying drawings, in which.

DETAILED DESCRIPTION OF THE PREFERRED EMBODIMENTS

Figure 1:
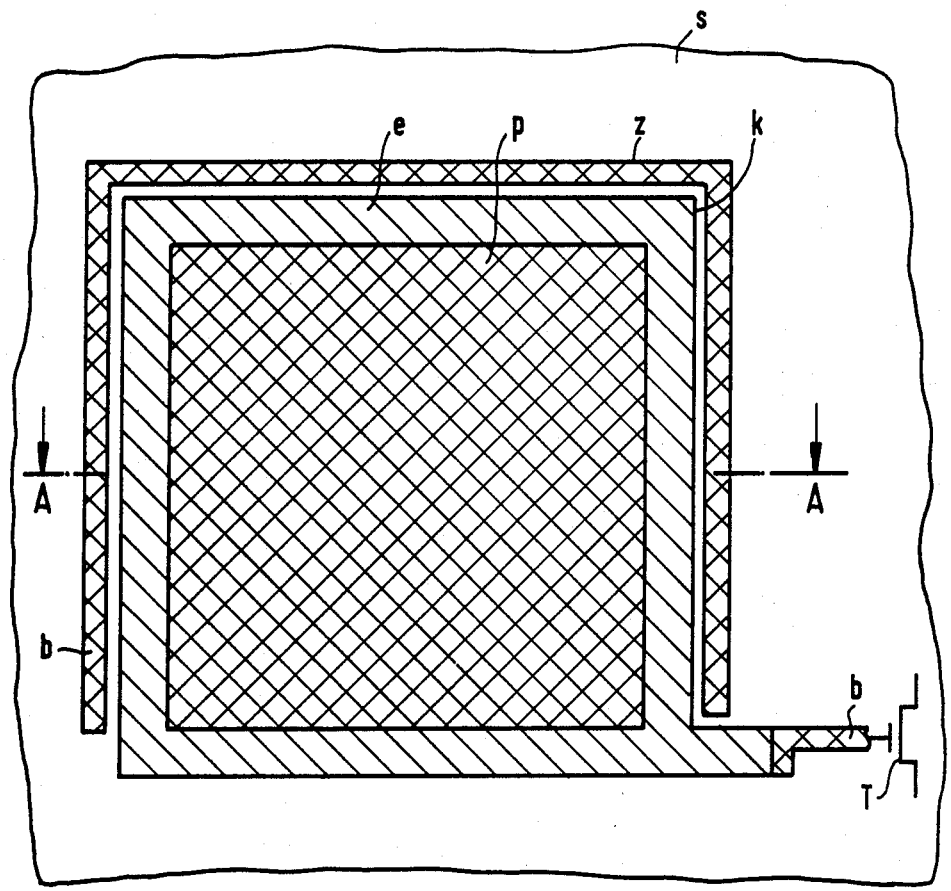
FIG. 1 is a highly schematic plan view of a preferred embodiment of a protective arrangement.

In the highly schematic plan view of the preferred embodiments of the Figures, the bypass transistor and the transistor to be protected are not shown for each of illustration. However, transistor T in FIG. 1 depicts one embodiment wherein the pad of the invention is connected to the gate of the transistor to be protected, namely transistor T. In FIG. 1, both the conducting surface of the pad p and the interconnection track b, generally made of a suitable metal such as aluminum, are cross-hatched. The simple, oblique hatching, whose lines run from the upper left to the lower right, marks the expansion region e, with which the above-mentioned resistor, which is connected between the pad and the transistor to be protected, is implemented.

In the invention, the expansion region e is incorporated in the substrate s (symbolized in FIG. 1 by the white areas) of the MOS integrated circuit, i.e., it can be formed within the substrate s by any of the conventional doping techniques, such as ion implantation or solid or vapor-phase diffusion. The conductivity type of the expansion region e is opposite to that of the substrate s, i.e., the expansion region e is of the same conductivity type as the source and drain regions of the transistors of the MOS circuit, and has low resistance.

The areal form of the expansion region e is equal to that of the pad p; in the preferred embodiment of FIG. 1, it is square, like the pad p. The central area of the expansion region e which supports the pad p is greater than the area of the pad and is in low-resistance contact with the latter, which can be achieved, for example, by a great number of small contact areas being arranged along the circumference of the pad p, which are not shown in FIG. 1 for the sake of clarity, but can be seen in the sectional view of FIG. 2 at the reference character c. The resistance of the aluminum pad contacting the heavily doped (n+) silicon region e at c creates a metal-semiconductor junction which has a substantially low ohmic resistance without the Schottky effect and is therefore not a rectifying junction. In FIG. 1, the pad area is surrounded by a strip of the expansion region e which has the same width throughout and extends beyond the pad in the plan view of FIG. 1. However, this is necessary only at those sides of the pad p which are adjacent to the region z, so that the area supporting the pad p need not be the central area of the expansion region e.

In FIG. 1, the expansion region e is accompanied on three sides by the elongate region z of minimum width which is spaced a minimum distance from the expansion region e. The elongate region z is of the same conductivity type and has the same resistivity as the expansion region e. It thus extends parallel to the three lateral edges of the extension region e, so that an enclosure of about 270 degrees is obtained.

By the terms "minimum width" and "minimum distance" are meant those minimum dimensions which are just permissible according to the design rules of a practical integrated circuit.

As mentioned and as indicated by the cross-hatching, low-resistance contact is made to the surface of the elongate region z over the entire length of the latter via the interconnection track b, which is connected to circuit ground. This connection is made via many small contact areas, two of which are shown in FIG. 2 at d.

Figure 2:
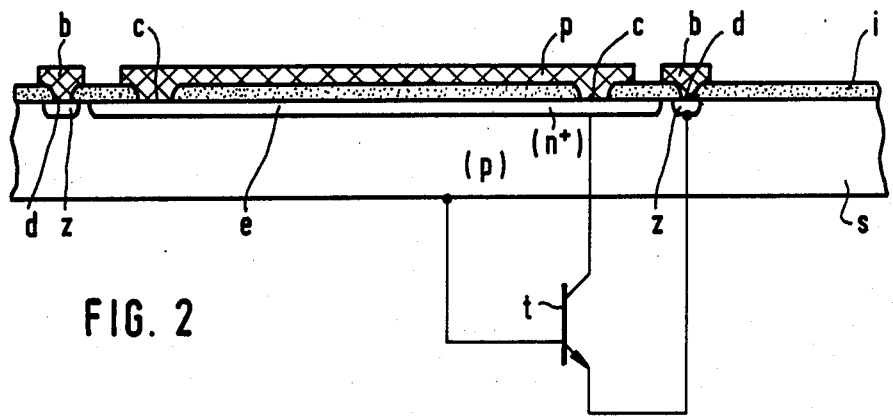
FIG. 2 shows a section taken along line A—A of FIG. 1 and an equivalent circuit for the arrangement of FIG. 1.

The portions of the individual regions determined by the geometry of FIG. 1 can be seen in FIG. 2, which is a sectional view taken along line A—A of FIG. 1, showing a MOS circuit with p-type substrate. Shown beginning on the left of FIG. 2 is the left-hand vertical portion of the region z of FIG. 1 together with the corresponding portion of the interconnection track b. This is followed by the expansion region e below the pad p; this region can be seen in its entire width, and its central area supports the insulating layer i, which, in turn, supports the pad p and which is connected to the latter through the areas c. Located next to the right-hand end of the expansion region e in FIG. 2 is the right-hand vertical portion of the elongate region z of FIG. 1.

The transistor t in FIG. 2 illustrates that on the occurrence of an overvoltage at the pad p, such as the application of the aforementioned test voltage, the substrate s acts as the base of the transistor t, the expansion region e as the collector, and the elongate region z as the emitter. By application of a high voltage at the pad p, the transistor t is driven into the breakdown region of the collector-emitter path, namely into the retrograde portion of the collector current/collector-emitter voltage characteristic. As a result, both the voltage at the pad and the energy transferred there are greatly reduced. In addition, the charge stored in the "base" suffices to keep the collector-emitter voltage low even when the current from the test-voltage source is decaying.

The breakdown of the emitter-collector region causes a voltage drop across the above-mentioned series resistor of the test arrangement which, on the one hand, prevents any destructive voltage from reaching the transistor to be protected and, on the other hand, reduces the current load on the bypass transistor if such a transistor is present. At the application of the test signal, the voltage at the pad p increases to the point that the pn junction between the expansion region e and the substrate s breaks down, thus raising the potential of the substrate until it becomes more positive than that of the grounded elongate region z. The elongate region z then acts as the emitter of the equivalent-circuit transistor t.

Figure 3:
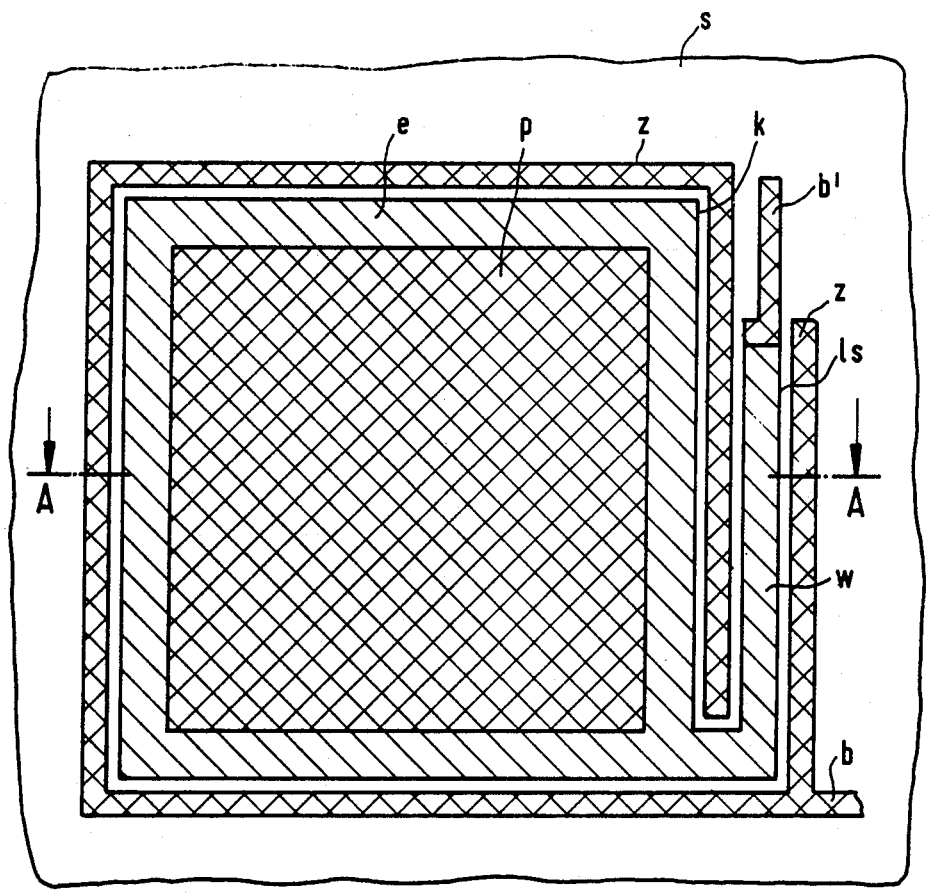
FIG. 3 is a highly schematic plan view of an embodiment of a development of the arrangement of FIG. 1.

In the highly schematic plan view of the embodiment of the development of FIG. 3, the bypass transistor and the transistor to be protected are not shown for the sake of clarity, as in FIG. 1. In FIG. 3, both the conducting surface of the pad p, generally made of a suitable metal, such as aluminum, and the interconnetion track b are cross-hatched. The simple, oblique hatching, whose lines run from the upper left to the lower right, illustrates the expansion region e and the resistance region w, with which the above-mentioned resistor, which is connected between the pad and the transistor to be protected, is implemented.

The resistance region w is incorporated in the substrate s (symbolized again by the white areas) of the MOS integrated circuit, represents an extension of the expansion region e, and has the same conductivity type and the same resistivity as the latter.

The resistance region w runs parallel to the right lateral edge k of the expansion region e and unites at the lower end with the lower right corner of the expansion region e as shown in FIG. 3. At its upper end, contact is made to it via the additional interconnection tract b', which leads to a terminal, e.g., the gate or source, of the transistor.

In FIG. 3, the elongate region z of minimum width continues between those two lateral edges of the resistance region w and the expansion region e which face each other. In addition to this portion, like in FIG. 1, the elongate region z extends parallel to the other lateral edges of the expansion region e and to that lateral edge ls of the resistance region w which is further from the expansion region e, so that a rectangular spiral with a rotation angle of about 400 degrees is obtained.

In FIG. 3, too, low-resistance contact is made to the surface of the elongate region z over the entire length of the latter via the interconnection track b, which is connected to circuit ground. This connection, too, is made via many small contact areas, a few of which can be seen in FIG. 4 at d.

Figure 4:
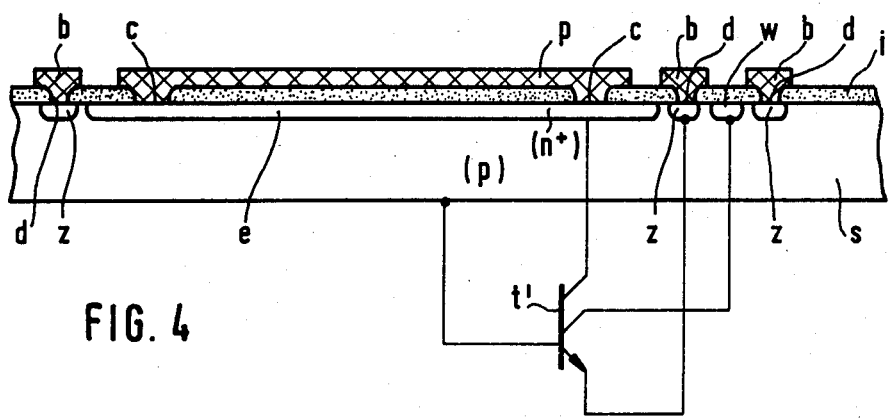
FIG. 4 shows a section taken along line A—A of FIG. 3 and the equivalent circuit for this arrangement.

FIG. 4 is a sectional view taken along line A—A of FIG. 3, analogously to FIG. 1 and FIG. 2. In addition to the regions shown i FIG. 2, the resistance region w and the right-hand portion of the elongate region z are provided at the right end as seen in FIG. 4. The transistor t' thus has an additional collector, which is formed by the resistance region w, acts in the same manner as the collector of FIG. 2, and supports the action of the latter.

Figure 5:
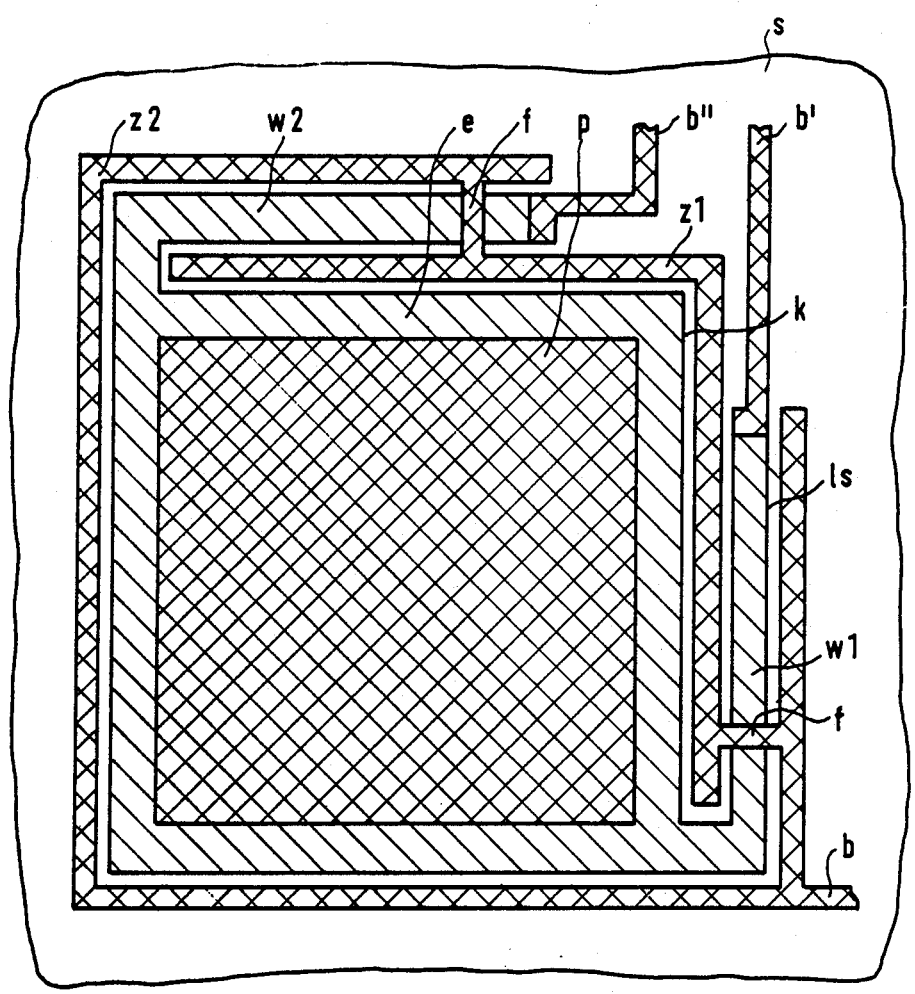
FIG. 5 is a highly schematic plan view of an embodiment with a twofold realization of a development of FIG. 3.

FIG. 5 shows, for example, the twofold realization of the development of FIG. 3 if the gate and the drain of the transistor, or two independent transistors have to be protected by one protective arrangement each. The resistance region w1 corresponds to the resistance region w of FIG. 3, while the resistance region w2 is disposed in the same manner at the corner opposite the corner forming the transition to the expansion region e. The two resistance regions w1, w2 necessitate the two elongate subregions z1, z2, the former being shaped like an L and lying between those lateral edges of the resistance region w1 and the expansion region e and of the resistance region w2 and the expansion region e which face each other.

The two resistance regions w1, w2 thus have a single expansion region e associated therewith, whereby a compact layout is obtained.

The other elongate subregion z2 extends parallel to the outer lateral edges of the expansion region e as in FIG. 3, and to those lateral edges of the resistance regions w1, w2 which do not face the lateral edges of an expansion region. In this case, the subregion z2 is a rectangular spiral with a rotation angle of only about 300 degrees. The two subregions z1, z2 are interconnected by conductive links f. Each resistance region w1, w2 is connected, for example, to a different terminal of the transistor to be protected.

The resistance of the respective resistance region w1, w2 is preferably made just high enough so that the operation of the MOS circuit connected via the two additional interconnection tracks b', b'' will not be disturbed by the resistor between the pad and the "first∞ transistor of the circuit. Furthermore, the size of its area is preferably such that the voltage drop, caused across the resistor by a standard test current value, is just equal to the breakdown voltage of the pn junction between the expansion region e and the substrate s. These areas are illustrated in the scale drawings of the preferred embodiments which show a pad with an overall size of approximately 100 by 100 micrometers.

If an overvoltage occurs at the pad p, the protective arrangement described thus produces a voltage drop along the resistance region w without any current flowing in the additional interconnection track b'. The magnitude of the voltage drop and the speed at which it develops are sufficient to protect subsequent circuits from destructive overvoltages.

Any second breakdown is prevented by the fact that the area of the expansion region e is greater than the area of the pad p, as was explained above. This results in a sufficient series resistance since the breakdown of the pn junction always begins at the edge. Each breakdown occurs at that point on an edge where the electric field strength is highest, which is typically where the curvature of the pn-junction reaches the substrate surface. The second breakdown occurs when the collector-to-emitter voltage is so high that the normal collector characteristics are no longer controlled by the base current.

Many modifications and alterations may be made to the illustrated embodiments without departing from the spirit and scope of the invention. Therefore, it must be understood that the illustrated embodiments have been shown only for the purpose of example and should not be taken as limiting the invention as defined in the following claims.

I claim:

1. An improvement in a protective arrangement for an insulated-gate field-effect transistor integrated circuit (MOS circuit) which lies between a pad (p) on an insulating layer (i) covering the substrate (s) of the MOS circuit and a transistor to be protected including a resistor of the opposite conductivity type which is incorporated in the substrate (s), said resistor connecting the pad to a terminal of the transistor:

wherein the resistor is comprised of a doped region (e) in said substrate (s) whose areal form is similar to that of the pad (p) and whose area supporting the pad, which is generally the central area of the region (e) and to which central area low-resistance contact is made via the pad, is greater than the pad area, and wherein the edge of the region (e) is accompanied, at least in part, by an elongate region (z, z1, z2) of minimum width spaced a minimum distance from said region (e), which:

(1) is of the same conductivity type and has the same resistivity as the region (e); and (2) is contacted at its surface by means of an interconnection track (b) connected to circuit ground, the connection between the surface and the interconnection track (b) having low resistance.

2. The improvement of claim 1, wherein the doped region (e) further comprises an elongate resistance region (w, w1, w2) which is disposed in the substrate (s), which extends parallel to at least one lateral edge (k) of the region (e), and which is separated from edge (h) or region (e) by said elongate region (z, z1, z2) of minimum width which further comprises a portion extending parallel to that long side (ls) of the resistance region (w, w1, w2) which long side (ls) is farthest from edge (k) of the region (e), which portion extends up to one end of the resistance region (w, w1, w2).

3. The improvement of claim 2, wherein the resistance of the elongate resistance region (w, w1, w2) is just high enough not to interfere with the operation of the MOS circuit, and wherein the elongate resistance region (w, w1, w2) has such an area that the voltage drop caused across it by a specified test current value is equal to the breakdown voltage of the pn junction between the region (e) and the substrate (s).

4. A resistor in an MOS integrated circuit substrate including a pad and a transistor comprising a resistor between said pad (p) and said transistor to be protected, said resistor comprising:

a doped region (e) within said substrate which lies completely below said pad (p) and extends beyond said pad along the entire circumference of said pad;

an interconnection track (b) disposed into said substrate; and an elongate region (z) extending along the circumference of said region (e) and connected to circuit ground via said interconnection track (b), the connection between said elongate region (z) and said interconnection track (b) having a low resistance, said elongate region (z) being spaced a minimum distance from said region (e).

5. The improvement of claim 4, wherein said region (e) further comprises an elongate resistance region (w, w1, w2) disposed in said substrate (s), said elongate resistance region (w, w1, w2) extending parallel to at least one lateral edge (k) of said region (e), said elongate resistance region (w, w1, w2) being separated from the remaining portion of said region (e) by said elongate region (z, z1, z2) of minimum width which also extnds parallel to that long side (ls) of said resistance region (w, w1, w2) which is farthest from said region (e), up to one end of said resistance region (w, w1, w2).

6. The improvement of claim 5, wherein the resistance of said elongate resistance region (w, w1, w2) is just high enough not to interfere with the operation of said MOS circuit, and wherein said elongate resistance region (w, w1, w2) has such an area that the voltage drop caused across it by a specified test current value is equal to the breakdown voltage of the pn junction between said region (e) and said substrate (s).

* * * * *